United States Patent
Kobayashi et al.

(10) Patent No.: US 8,188,494 B2
(45) Date of Patent: May 29, 2012

(54) UTILIZING NANOWIRE FOR GENERATING WHITE LIGHT

(75) Inventors: Nobuhiko P. Kobayashi, Palo Alto, CA (US); Shih-Yuan Wang, Palo Alto, CA (US); M. Saif Islam, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 826 days.

(21) Appl. No.: 11/477,298

(22) Filed: Jun. 28, 2006

(65) Prior Publication Data

US 2008/0001161 A1   Jan. 3, 2008

(51) Int. Cl.
*H01L 33/00*   (2010.01)
*H01L 21/00*   (2006.01)

(52) U.S. Cl. .......... 257/98; 257/13; 257/E33.06; 438/29
(58) Field of Classification Search ............. 257/13, 257/98, E33.06; 438/29
See application file for complete search history.

(56) References Cited

U.S. PATENT DOCUMENTS

| | | | |
|---|---|---|---|
| 6,501,091 B1 * | 12/2002 | Bawendi et al. | 257/14 |
| 7,196,354 B1 * | 3/2007 | Erchak et al. | 257/79 |
| 2003/0030067 A1 * | 2/2003 | Chen | 257/102 |
| 2005/0224780 A1 * | 10/2005 | Jin et al. | 257/13 |
| 2005/0230691 A1 * | 10/2005 | Amiotti et al. | 257/79 |
| 2005/0253502 A1 * | 11/2005 | Gokturk | 313/503 |
| 2006/0273328 A1 * | 12/2006 | Niu et al. | 257/79 |
| 2008/0185604 A1 * | 8/2008 | Kim | 257/98 |

OTHER PUBLICATIONS

Gao, et al.; "Three-dimensional interconnected nanowire networks of ZnO"; Chemical Physics Letters 408 (2005) 174-178; Apr. 1, 2005; Available online at www.sciencedirect.com.

Lin, et al.; "Enhanced Luminescent and Electrical Properties of Hydrogen-Plasma ZnO Nanorods Grown on Wafer-Scale Flexible Substrates"; Applied Physics Letters 86, 183103 2005.

Vaddiraju, et al.; "Mechanisms of 1D Crystal Growth in Reactive Vapor Transport: Indium Nitride Nanowires"; Nano Letters vol. 0, No. 0 A-G; Jun. 15, 2005.

Chandrasekaran, Hari et al., "Growth of Gallium Nitride Textured Films and Nanowires on Polycrystalline Substrates at sub-Atmospheric Pressures", *Materials Research Society Symposium Proceedings*, vol. 693, (2002),159-164.

* cited by examiner

*Primary Examiner* — Steven J Fulk

(57) ABSTRACT

One embodiment in accordance with the invention is an apparatus that can include a light emitting diode that is for of outputting light in the blue wavelength. Furthermore, the apparatus can also include a nanowire or nanoparticle coupled to a surface of the light emitting diode. Additionally, the apparatus can include an electrode coupled to the light emitting diode, wherein the nanowire or nanoparticle is for receiving and converting the light into red and green light that is output from the nanowire or nanoparticle.

18 Claims, 11 Drawing Sheets

900

START

↓

A light emitting diode can be fabricated for outputting light in the blue wavelength and/or the ultraviolet wavelength.
902

↓

One or more nanowires or nanoparticles can be disposed on a surface of the light emitting diode, wherein the one or more nanowires or nanoparticles can be for receiving and converting the light into either red and green light or red, green and blue light that can be output from the one or more nanowires or nanoparticles.
904

↓

END

FIG. 9

UTILIZING NANOWIRE FOR GENERATING WHITE LIGHT

BACKGROUND

Currently, there are at least four different ways to fabricate a white light source with light emitting diode (LED) technology. For example, the first technique involves utilizing a red LED, a blue LED, and a green LED. The combined output of these LEDs is mixed or combined to create white light. However, this technique can be expensive, in particular when creating a large area white light source, since it involves many groups of at least three LEDs to create the white light.

The second technique involves adhering yellow phosphor granules to a blue LED with an epoxy. As such, part of the blue light output by the LED excites the yellow phosphor causing it to emit a broad range of spectrum covering red and green light that combines with the blue light of the LED to make white light. However, some of the problems associated with this technique are that it has low conversion efficiency at the phosphor granules and the epoxy tends to degrade as it is exposed to the blue light from the blue LED, causing it to become cloudy.

The third technique involves adhering red, green and blue (RGB) phosphor granules to a ultra-violet (UV) LED with an epoxy. As such, the UV light output by the LED excites the RGB phosphor causing them to emit a broad range of spectrum covering red, green and blue light, resulting in the generation of white light. However, some of the problems associated with this technique are that it has, as in the second technique described above, low conversion efficiency at the phosphor granules and the epoxy tends to degrade as it is exposed to the UV light from the UV LED causing it to become cloudy.

The fourth technique involves an effort to try and grow a gallium nitride (GaN) LED structure on a zinc oxide (ZnO) substrate. As such, the blue light output by the GaN LED excites the ZnO substrate, which generates red and green light. When these red and green lights are combined with the original blue light from the GaN LED, it results in white light. However, one of the problems associated with this technique is that it is very difficult to grow a GaN LED on a ZnO substrate without including defects within the GaN LED since the two different materials have very different physical characteristics. It is noted that the defects within the GaN LED can cause it to adversely degrade. Another problem associated with this technique is the fact that the ZnO substrate is currently very expensive to purchase, thereby adversely driving up the cost of the overall product.

Therefore, it is desirable to address one or more of the above issues.

BRIEF DESCRIPTION OF THE DRAWINGS

FIG. 9 is flow diagram of a method in accordance with various embodiments of the invention.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
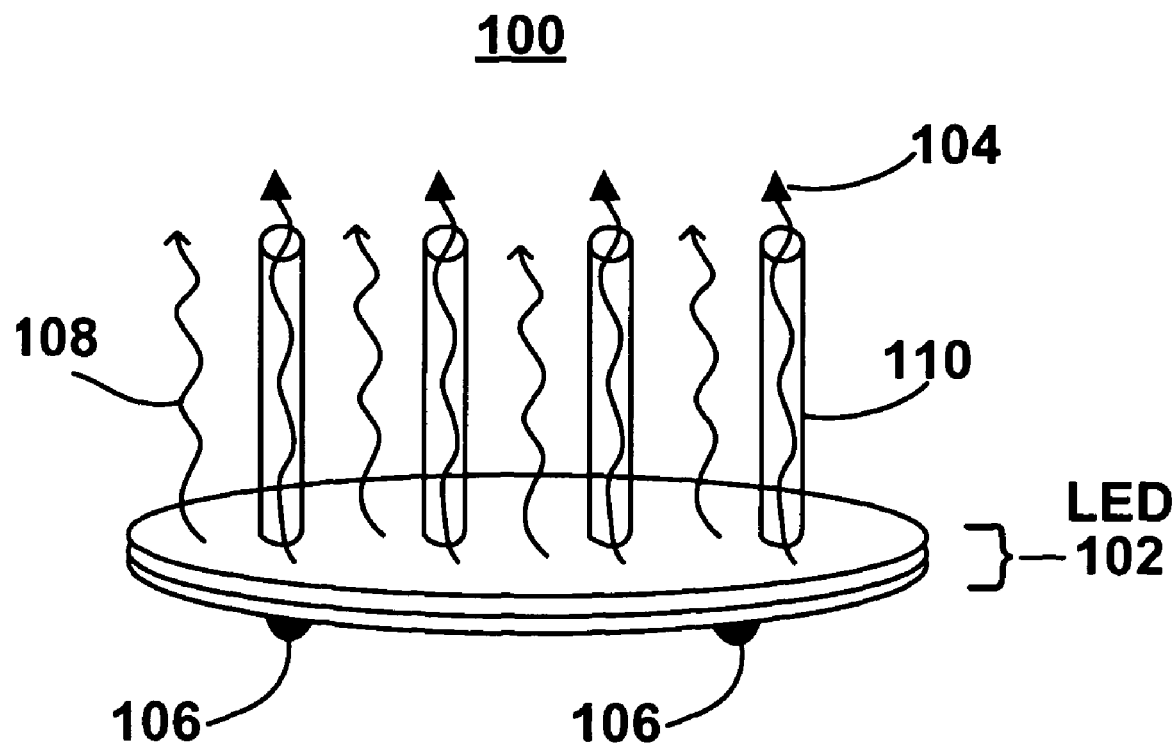
FIG. 1 is a side perspective view of an exemplary apparatus that includes one or more nanowires in accordance with various embodiments of the invention.

FIG. 1 is a side perspective view of an exemplary white light source apparatus 100 that includes one or more nanowires 110 grown (or formed) in a substantial vertical (or "column") configuration in accordance with various embodiments of the invention. Specifically, within apparatus 100, one or more single crystalline nanowires 110 can be grown on one or more surfaces of a blue or ultraviolet (UV) light emitting diode (LED) 102. As such, when the blue LED 102 generates light within the blue wavelength (represented by an open-ended arrowhead), some of that blue light 108 can be absorbed and converted by the nanowires 110 into light within a wide range of spectrum covering green and red light 104 (represented by a solid closed-ended arrowhead). Therefore, the apparatus 100 enables the blue light 108 of the blue LED 102 to be mixed efficiently with the green and red light 104 generated by the nanowires 110 to produce an overall effect of white light. Note that apparatus 100 can be referred to as a white LED 100. In addition, when a UV LED 102 generates light within the UV wavelength (represented by an open-ended arrowhead), some of that UV light 108 can be absorbed and converted by the nanowires 110 into light within a wide range of spectrum covering blue, green and red light 104 (represented by a solid closed-ended arrowhead). Therefore, the apparatus 100 enables the red, green and blue light 104 to be mixed efficiently and produces an overall effect of white light. In this manner, apparatus 100 can be referred to as a white LED 100.

Within apparatus 100, it is understood that the blue or UV LED 102 can be implemented with gallium nitride (GaN) and related alloys such as aluminum gallium nitride (AlGaN), but is not limited to such. It is understood that any type of LED that is able to excite the nanowires 110 can be utilized within apparatus 100. The nanowires 110 of apparatus 100 can be implemented with, but is not limited to, a group II-VI compound semiconductor material (e.g., zinc oxide (ZnO), zinc selenide (ZnSe), cadmium selenide (CdSe), etc.) and related alloys, a group III-V compound semiconductor material (e.g., gallium arsenide (GaAs), indium phosphide (InP), etc.) and related alloys, any material having an ability to emit a broad range of spectrum covering red, green and blue, i.e. white light when mixed, as a result of absorbing light at around 500 nanometers (nm)+/−150 nm that comes from LED 102, and any material having a band gap approximately 500 nanometers (nm)+/−150 nm. Moreover, it is pointed out that nanowires 110 can be heavily doped as part of apparatus 100. Note that when the nanowires 110 are doped heavily, the absorption spectrum gets broader thereby enabling the nanowires 110 to emit or output a broader spectrum when excited by the reception of the light 108 from the LED 102. For example, "heavily" doped ZnO (Eg=3.3 eV) can emit a desirable broad spectrum for generating white light when excited by the blue light 108 output by a blue LED 102 (based on it being implemented with GaN and related alloys such as indium gallium arsenide (InGaAs)). Note that if the nanowires 110 are implemented with ZnO, they can be doped with magnesium (Mg), beryllium (Be), calcium (Ca), strontium (Sr), barium (Ba), radium (Ra), or any other material above or below magnesium within the periodic table. The heavily doping of the ZnO nanowires can be greater than $5 \times 10^{19}$ cm$^{-3}$, but is not limited to such. It is understood that if the nanowires 110 are implemented with group III-V compound semiconductor material and related alloys, they can be heavily doped with, but are not limited to, zinc (Zn), silicon (Si), carbon (C), or anything within group II or group VI can be used as the dopant.

Within FIG. 1, it is noted that the nanowires 110 can be epitaxially grown on the LED 102 substrate. In various embodiments, the epitaxial growth process can include, but is not limited to, utilizing vapor phase synthesis. When the nanowires 110 are grown on the LED 102, constraints associated with the lattice mismatch are much more relaxed and there are just minimum lattice mismatch problems. It is understood that the fabricating of apparatus 100 can include utilizing a high quality LED structure for LED 102, while the nanowires 110 that are grown (or formed) do not have to be high quality as long as the nanowires 110 have an ability to convert the light emitted by the LED 102 into a broad range of spectrum covering red, green and blue light for a UV LED 102 or red and green light for a blue LED 102. Furthermore, the nanowires 110 can be either aligned along a specific direction with respect to the LED 102 or randomly oriented. Therefore, the expense of manufacturing apparatus 100 is advantageously reduced because of the above mentioned factors.

Within apparatus 100, it is appreciated that when a blue LED 102 is implemented with a high quality GaN and related alloys, it can produce light having a wavelength of approximately 470 nm. Subsequently, the nanowires 110 (which can be heavily doped) can be formed or grown on the blue LED 102. As such, the blue light 108 output by the blue LED 102 can go into the nanowires 110 and get converted into a spectrum that covers approximately 520-630 nm, which is basically red and green light. It is understood that when the blue LED light 108 enters the nanowires 110, the energy of the blue light 108 can be converted from a high energy to a lower energy.

Within FIG. 1, it is appreciated that the nanowires 110 can be grown with different doping levels thereby resulting in covering various emission spectrum ranges among nanowires 110. For example, one or more of nanowires 110 can be grown with a first type of doping having a first range of emission spectrum while one or more of nanowires 110 can be grown with a second type of doping having a different range of emission spectrum, and so forth. In this manner, the color rendering, one of the important characteristics of white light, of the resulting white light can be tuned. It is understood that the nanowires 110 can be grown having one doping level resulting in an emission spectrum or the nanowires 110 can be grown having various levels of dopings.

The apparatus 100 can include, but is not limited to, electrodes 106 that can be electrically coupled to the blue or UV LED 102. The electrodes 106 can enable a current or voltage source and voltage ground (neither shown) to be coupled to the blue or UV LED 102. Furthermore, one or more nanowires 110 can be grown, formed, or disposed on the blue or UV LED 102. Note that the one or more surfaces of the LED 102 that the one or more nanowires 110 can be grown, formed, or disposed on can include non-single crystal material such as, but not limited to, polycrystalline silicon, amorphous silicon, poly-crystal (grain size is in the range of micro meter to nano meter) diamond and related carbon-based materials and/or microcrystalline silicon, and the like.

Figure 2:
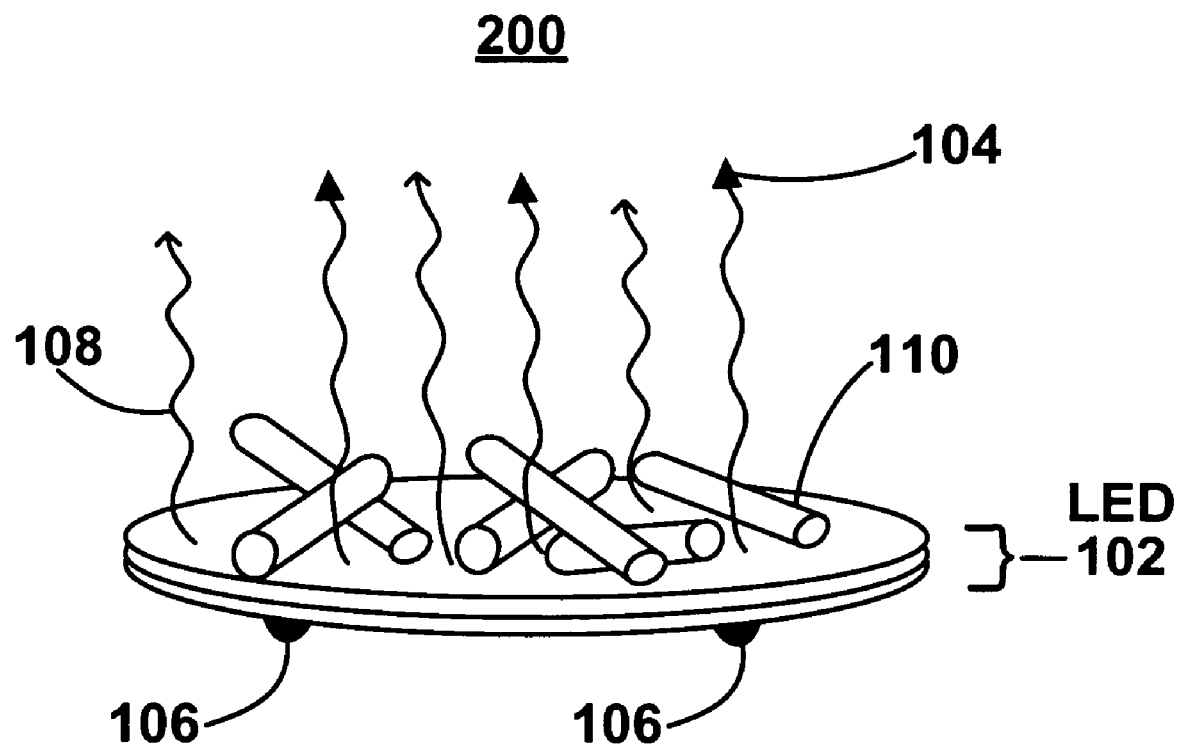
FIG. 2 is a side perspective view of another exemplary apparatus that includes one or more nanowires in accordance with various embodiments of the invention.

FIG. 2 is a side perspective view of an exemplary white light source apparatus 200 that can include one or more nanowires 110 dispersed (or sprinkled or grown or formed) in a random configuration in accordance with various embodiments of the invention. It is noted that apparatus 200 is similar to apparatus 100 of FIG. 1. However, the nanowires 110 of apparatus 200 can be in a configuration where the nanowires 110 can be aligned along a specific orientation with respect to the LED 102, randomly aligned or simply laid down on one or more surfaces of the LED 102. Even though configured in these ways, the apparatus 200 can be implemented and operate in any manner similar to apparatus 100, as described herein.

Figure 5:
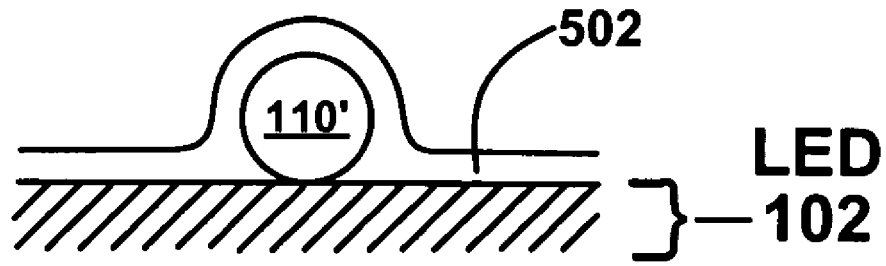
FIG. 5 is a side section view of an exemplary technique for coupling one or more nano-particles (or nanowires) to a LED in accordance with various embodiments of the invention.

Specifically, if the nanowires 110 are dispersed or sprinkled onto one or more surfaces of the LED 102 in a random configuration, the nanowires 110 could have been grown on some foreign substrate (not shown), scraped off that foreign substrate, and then dispersed or sprinkled onto the LED 102. Furthermore, the nanowires 110 can be coupled or attached to the fabricated blue 102 in a wide variety of ways. For example in various embodiments, the nanowires 110 can be coupled or attached by utilizing a polymer rinse. In various embodiments, the nanowires 110 can be coupled or attached by utilizing an atomic layer deposition (ALD) process (as shown in FIG. 5) or any other analogous film deposition processes. In this manner, a coating can be formed over the nanowires 110 of a transparent dielectric (e.g., aluminum oxide (AlO$_x$)) that is transparent to visible light. In various embodiments, if the nanowires 110 are not dispersed or sprinkled onto the LED 102, the nanowires 110 can be grown on one or more surfaces of the LED 102.

Within FIG. 2, the apparatus 200 can include, but is not limited to, electrodes 106 that can be electrically coupled to the blue or UV LED 102. The electrodes 106 can enable a voltage source and voltage ground (neither shown) to be coupled to the blue or UV LED 102. Additionally, one or more nanowires 110 can be dispersed, sprinkled, grown, formed, or disposed on the blue or UV LED 102. Note that when a blue LED 102 generates light within the blue wavelength 108 (represented by an open-ended arrowhead), some of that blue light 108 can be absorbed and converted by the nanowires 110 into light within a wide range of spectrum covering green and red light 104 (represented by a solid closed-ended arrowhead). Additionally, when the UV LED 102 generates light within the UV wavelength 108 (represented by an open-ended arrowhead), some of that UV light 108 can be absorbed and converted by the nanowires 110 into light within a wide range of spectrum covering blue, green and red light 104 (represented by a solid closed-ended arrowhead).

Figure 3:
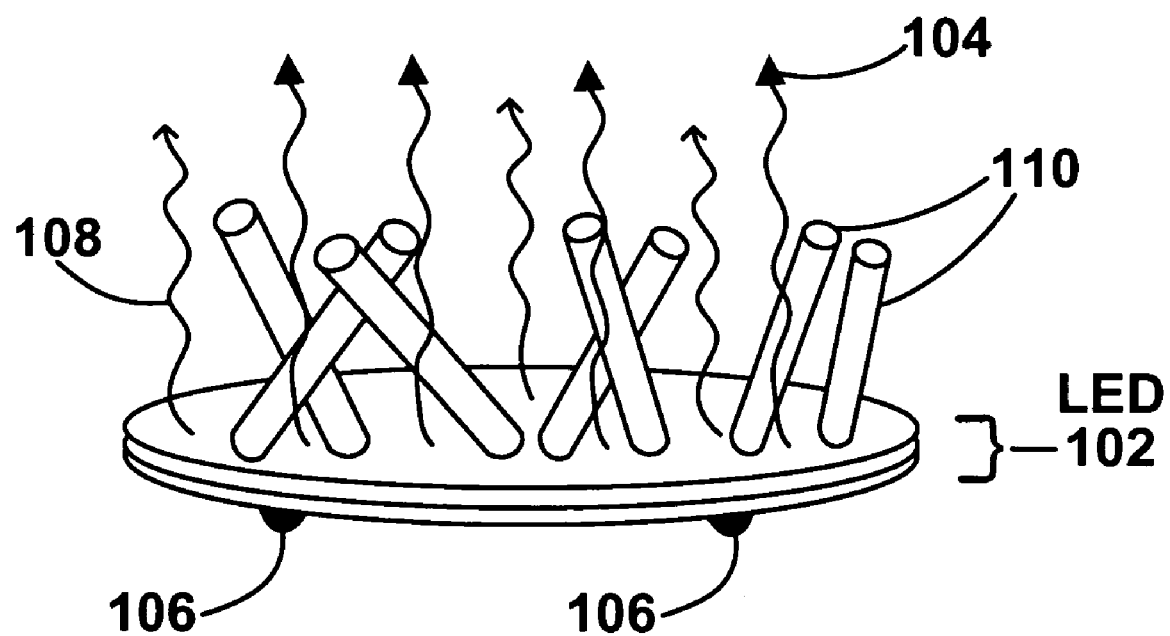
FIG. 3 is a side perspective view of yet another exemplary apparatus that includes one or more nanowires in accordance with various embodiments of the invention.

FIG. 3 is a side perspective view of an exemplary white light source apparatus 300 that includes one or more nanowires 110 grown (or formed) in a random configuration in accordance with various embodiments of the invention. It is noted that apparatus 300 is similar to apparatus 100 of FIG. 1. However, the nanowires 110 of apparatus 300 can be in a configuration wherein the nanowires 110 can be aligned or randomly aligned. Specifically, the nanowires 110 of apparatus 300 can be grown (or formed) on the blue or UV LED 102 in any configuration. Even though configured in these ways, the apparatus 300 can be implemented and operate in any manner similar to apparatus 100, as described herein.

Within FIG. 3, the apparatus 300 can include, but is not limited to, electrodes 106 that can be electrically coupled to the blue or UV LED 102. The electrodes 106 can enable a current or voltage source and voltage ground (neither shown) to be coupled to the blue or UV LED 102. Additionally, one or more nanowires 110 can be dispersed, sprinkled, grown, formed, or disposed on the blue or UV LED 102 as shown in apparatus 300. It is appreciated that when the blue LED 102 generates light within the blue wavelength 108 (represented by an open-ended arrowhead), some of that blue light 108 can be absorbed and converted by the nanowires 110 into light within a wide range of spectrum covering green and red light 104 (represented by a solid closed-ended arrowhead). Furthermore, when the UV LED 102 generates light within the UV wavelength 108 (represented by an open-ended arrowhead), some of that UV light 108 can be absorbed and converted by the nanowires 110 into light within a wide range of spectrum covering blue, green and red light 104 (represented by a solid closed-ended arrowhead).

Figure 4:
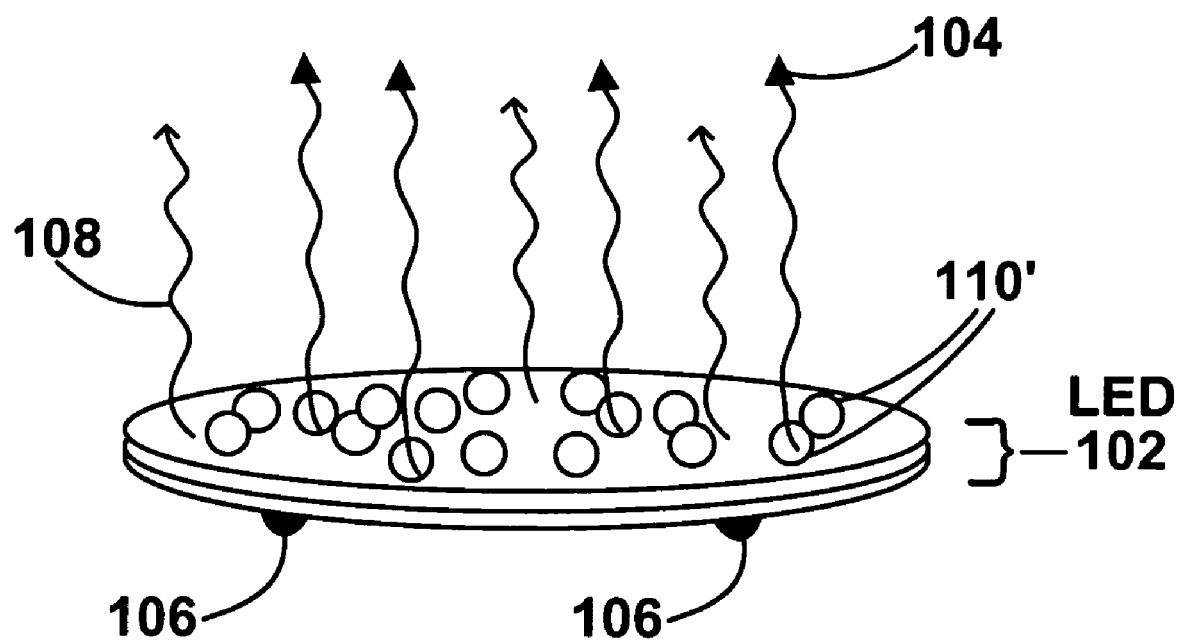
FIG. 4 is a side perspective view of an exemplary apparatus that includes one or more nano-particles in accordance with various embodiments of the invention.

FIG. 4 is a side perspective view of an exemplary white light source apparatus 400 that includes one or more nano-particles 110' dispersed (or sprinkled or grown or formed) in a random configuration in accordance with various embodiments of the invention. It is noted that apparatus 400 is similar to apparatus 100 of FIG. 1. However, the nano-particles 110' of apparatus 400 can be in a configuration where they can be arranged in an array or in a random manner. Even though configured in these ways, the apparatus 400 can be implemented and operate in any manner similar to apparatus 100, as described herein.

Specifically, the single crystalline nano-particles 110' can be implemented in any manner similar to nanowires 110, as described herein. It is noted that nano-particles 110' can be grown or formed in any manner similar to nanowires 110. The growth technique for nano-particles 110' can just involve growing something (or anything) utilizing any nanowire growth technique. Note that the one or more surfaces of the LED 102 that the one or more nano-particles 110' can be grown, formed, or disposed on can include non-single crystal material such as, but not limited to, polycrystalline silicon, amorphous silicon, poly-crystal (grain size is in the range of micro meter to nano meter) diamond and related carbon-based materials and/or microcrystalline silicon, and the like. It is pointed out that there is a very convenient cheap chemical method to produce nano-particles 110'. However the nano-particles 110' are formed, they can be sprinkled or dispersed onto one or more surfaces of the LED 102.

Within FIG. 4, if the nano-particles 110' are dispersed or sprinkled onto one or more surfaces of the blue LED 102 in any configuration, the nano-particles 110' can be coupled or attached to the fabricated LED 102 in a wide variety of ways. For example in various embodiments, the nano-particles 110' can be coupled or attached by utilizing a polymer rinse. In various embodiments, the nano-particles 110' can be coupled or attached to the LED 102 by utilizing, for example, an atomic layer deposition (ALD) process as shown in FIG. 5 or any other analogous film deposition processes.

Specifically, FIG. 5 is a side section view of an exemplary technique 500 for coupling one or more nano-particles 110' (or nanowires 110) to a LED (e.g., 102) in accordance with various embodiments of the invention. For example, a coating 502 can be formed over the nano-particles 110' (or nanowires 110) and the one or more surfaces of the LED 102 of a transparent dielectric (e.g., aluminum oxide ($AlO_x$)) that is transparent to visible light. In this manner, the coating 502 couples or attaches the one or more nano-particles 110' (or nanowires 110) to the LED 102. In various embodiments, if the nano-particles 110' (or nanowires 110) are not dispersed or sprinkled onto the LED 102, the nano-particles 110' (or nanowires 110) can be grown on one or more surfaces of the LED 102.

Within FIG. 4, the apparatus 400 can include, but is not limited to, electrodes 106 that can be electrically coupled to the blue or UV LED 102. The electrodes 106 can enable a current or voltage source and voltage ground (neither shown) to be coupled to the blue or UV LED 102. Moreover, one or more nano-particles 110' can be dispersed, sprinkled, grown, formed, or disposed on the blue or UV LED 102. It is understood that when the blue LED 102 generates light within the blue wavelength 108 (represented by an open-ended arrowhead), some of that blue light 108 can be absorbed and converted by the nano-particles 110' into light within a wide range of spectrum covering green and red light 104 (represented by a solid closed-ended arrowhead). It is further understood that when the UV LED 102 generates UV light within the UV wavelength 108 (represented by an open-ended arrowhead), some of that UV light 108 can be absorbed and converted by the nano-particles 110' into light within a wide range of spectrum covering red, green and blue light 104 (represented by a solid closed-ended arrowhead).

Figure 6:
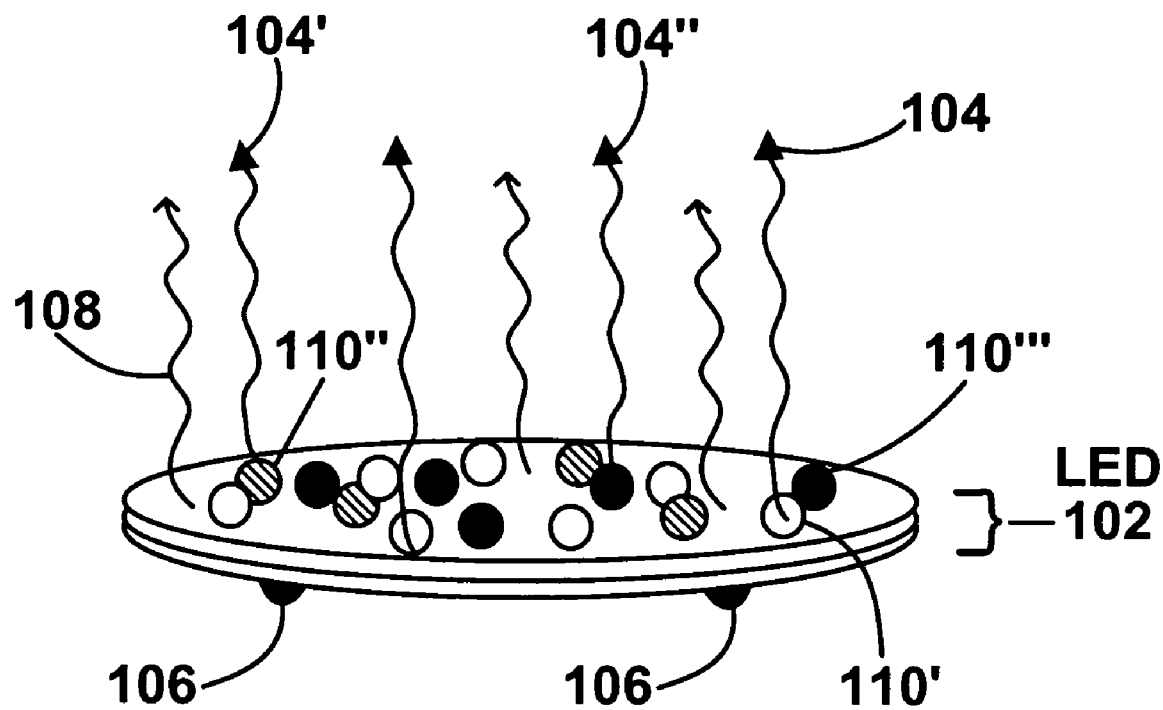
FIG. 6 is a side perspective view of another exemplary apparatus that includes one or more nano-particles in accordance with various embodiments of the invention.

FIG. 6 is a side perspective view of an exemplary white light source apparatus 600 that includes one or more nano-particles (e.g., 110', 110", and 110''') dispersed or sprinkled or grown or formed in an array or in a random manner in accordance with various embodiments of the invention. It is noted that apparatus 600 is similar to apparatuses 100 and 400 of FIGS. 1 and 4, respectively. However, the nano-particles 110', 110" and 110''' of apparatus 600 can be doped differently or made of different materials from each other. Even though configured in this manner, the apparatus 600 can be implemented and operate in any manner similar to apparatuses 100 and 400, as described herein. The one or more nano-particles 110', 110" and 110''' can each be implemented in any manner similar to the one or more nanowires 110, described herein.

Within apparatus 600 there are three groups of nano-particles that have each been doped differently or made of different materials. Specifically, there can be a group of first doped nano-particles (or nano-particles made of first material) 110' having a first range of emission spectrum 104, a group of second doped nano-particles (or nano-particles made of second material) 110" having a different second range of emission spectrum 104', and a group of third doped nano-particles (or nano-particles made of third material) 110''' having a different third range of emission spectrum 104". In this manner, for example, the spectrum width of wavelength around red, green and blue lights 104, 104' and 104" can be tuned to produce various white lights having different color rendering.

Within FIG. 6, the apparatus 600 can include, but is not limited to, electrodes 106 that can be electrically coupled to the blue or UV LED 102. The electrodes 106 can enable a current or voltage source and voltage ground (neither shown) to be coupled to the blue or UV LED 102. Additionally, one or more nano-particles 110', 110" and 110''' can be dispersed, sprinkled, grown, formed, or disposed on the blue or UV LED 102. It is noted that when the blue LED 102 generates light within the blue wavelength (represented by an open-ended arrowhead), some of that blue light 108 can be absorbed and converted by the nano-particles 110', 110" and 110''' into light within the wavelength of green and red light 104, 104' and 104", respectively (represented by a solid closed-ended arrowhead). When the UV LED 102 generates light within the ultraviolet wavelength (represented by an open-ended arrowhead), some of that ultraviolet light 108 can be absorbed and converted by the nano-particles 110', 110" and 110''' into light within the wavelength of red, green and blue light 104, 104' and 104", respectively (represented by a solid closed-ended arrowhead).

Figure 7A:
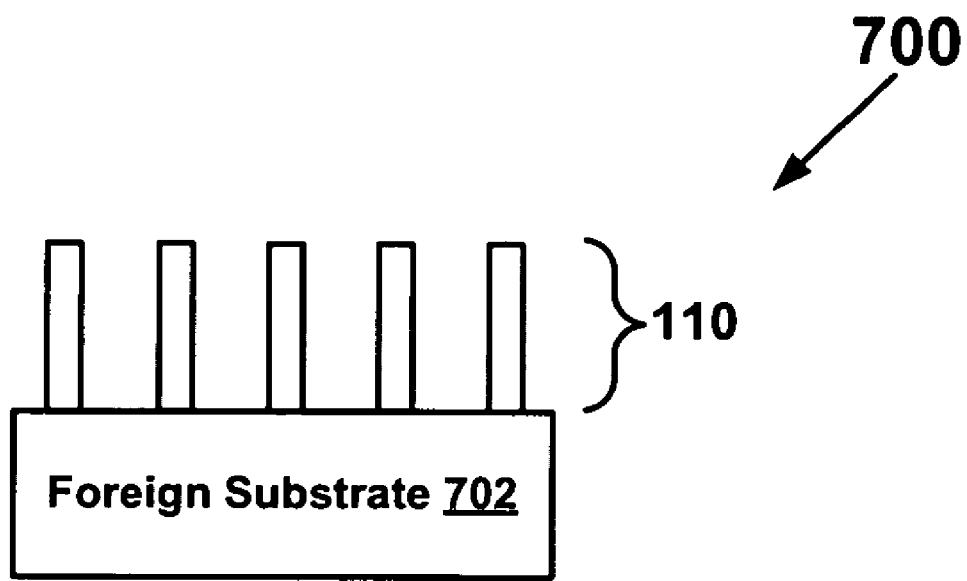
FIGS. 7A and 7B are side perspective views of fabrication of exemplary apparatuses that include one or more nanowires in accordance with various embodiments of the invention.
Figure 7B:
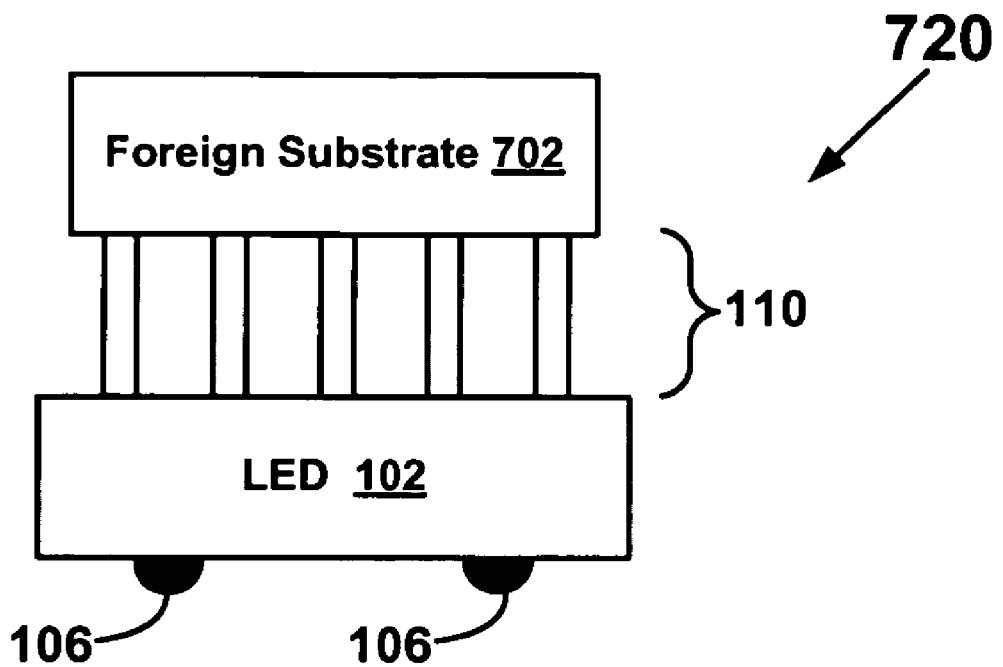

FIGS. 7A and 7B are side perspective views of fabricating exemplary apparatuses 700 and 720 that each include one or more nanowires 110 in accordance with various embodiments of the invention. Specifically, within FIG. 7A, one or more nanowires 110 can be grown or formed on a foreign substrate (e.g., glass, transparent material, and the like) 702 thereby resulting in apparatus 700. Note that the foreign substrate 702 can be foreign to the LED 102. Next, within FIG. 7B, the foreign substrate 702 and its nanowires 110 of apparatus 700 can be inverted (or flipped over) and then the nanowires 110 can be abutted or coupled to a blue or UV LED 102, thereby forming apparatus 720. In this manner, the nanowires 110 and the LED 102 of apparatus 720 can be implemented and operate in any manner similar to apparatuses 100, 200, and 300 as described herein.

The apparatus 720 of FIG. 7B can include, but is not limited to, electrodes 106 that can be electrically coupled to the blue or UV LED 102. The electrodes 106 can enable a current or voltage source and voltage ground (neither shown) to be coupled to the blue or UV LED 102. Additionally, one or more nanowires 110 can be dispersed, sprinkled, grown, formed, or disposed on the foreign substrate 702. Moreover, it is understood that one or more of the nanowires 110 can be doped differently from each other, as described herein. It is understood that the one or more nanowires 110 of FIGS. 7A and 7B can be configured in any manner shown and/or described herein, but is not limited to such.

Figure 8A:
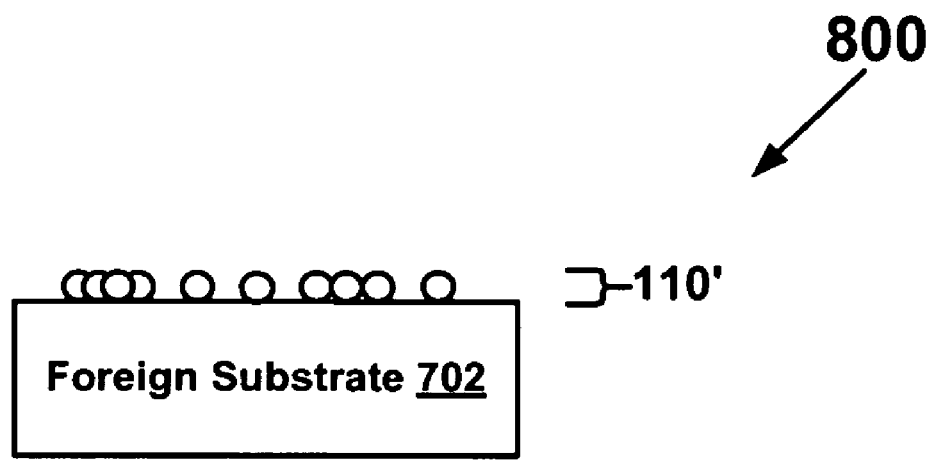
FIGS. 8A and 8B are side perspective views of fabrication of exemplary apparatuses that include one or more nanoparticles in accordance with various embodiments of the invention.
Figure 8B:
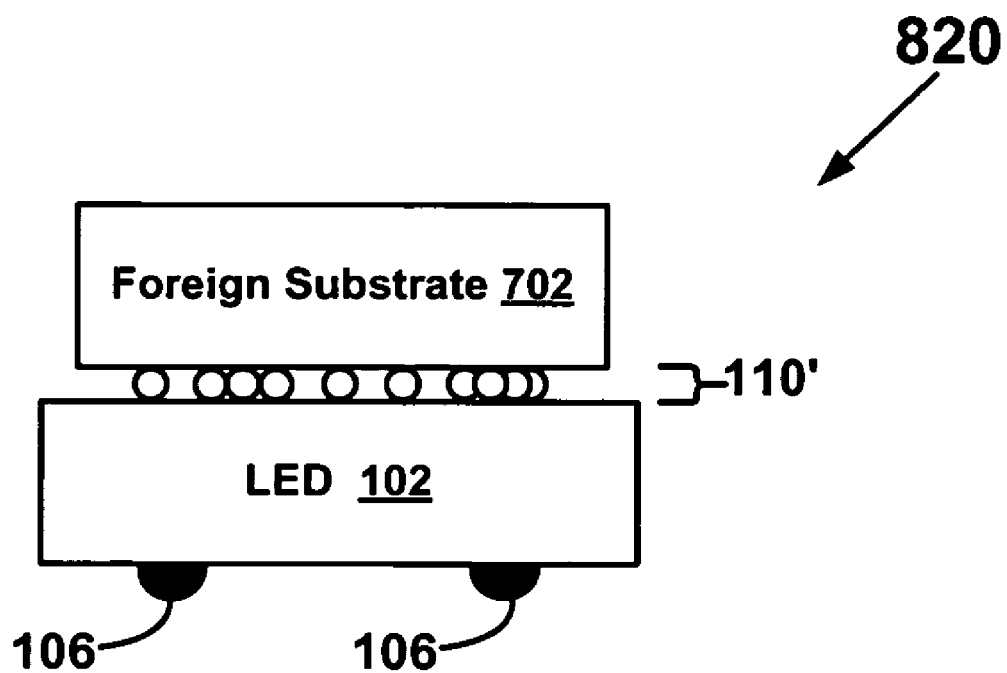

FIGS. 8A and 8B are side perspective views of fabricating exemplary apparatuses 800 and 820 that each include one or more nano-particles 110' in accordance with various embodiments of the invention. Specifically, within FIG. 8A, one or more nanoparticles 110' can be grown or formed on a foreign substrate (e.g., glass, transparent material, and the like) 702 thereby resulting in apparatus 800. Note that the foreign substrate 702 can be foreign to the LED 102. Next, within FIG. 8B, the foreign substrate 702 and its nanoparticles 110' of apparatus 800 can be inverted (or flipped over) and then the nanoparticles 110' can be abutted or coupled to a blue or UV LED 102, thereby forming apparatus 820. In this manner, the nanoparticles 110' and the LED 102 of apparatus 820 can be implemented and operate in any manner similar to apparatuses 100, 200, and 300 as described herein.

The apparatus 820 of FIG. 8B can include, but is not limited to, electrodes 106 that can be electrically coupled to the blue or UV LED 102. The electrodes 106 can enable a current or voltage source and voltage ground (neither shown) to be coupled to the blue or UV LED 102. Additionally, one or more nanoparticles 110' can be dispersed, sprinkled, grown, formed, or disposed on the foreign substrate 702. Furthermore, it is understood that one or more of the nanoparticles 110' can be doped differently from each other, as described herein. It is understood that the one or more nanoparticles 110' of FIGS. 8A and 8B can be configured in any manner shown and/or described herein, but is not limited to such.

FIG. 9 is a flow diagram of a method 900 for fabricating a white light source apparatus that includes one or more nanowires or nano-particles in accordance with various embodiments of the invention. Method 900 includes exemplary processes of various embodiments of the invention that can be carried out by a processor(s) and electrical components under the control of computing device readable and executable instructions (or code), e.g., software. The computing device readable and executable instructions (or code) may reside, for example, in data storage features such as volatile memory, non-volatile memory and/or mass data storage that can be usable by a computing device. However, the computing device readable and executable instructions (or code) may reside in any type of computing device readable medium. Although specific operations are disclosed in method 900, such operations are exemplary. Method 900 may not include all of the operations illustrated by FIG. 9. Also, method 900 may include various other operations and/or variations of the operations shown by FIG. 9. Likewise, the sequence of the operations of method 900 can be modified. It is noted that the operations of method 900 can be performed by software, by firmware, by electronic hardware, or by any combination thereof.

Specifically, a light emitting diode can be fabricated for outputting light in the blue wavelength and/or the ultraviolet wavelength. One or more nanowires or nano-particles can be disposed on one or more surfaces of the light emitting diode. It is noted that the one or more nanowires or nano-particles can each be for receiving and converting the light into either red and green light, or red, green and blue light that is output from each nanowire or nano-particle.

At operation 902 of FIG. 9, a light emitting diode (e.g., 102) can be fabricated for outputting light (e.g., 108) in the blue wavelength and/or the ultraviolet wavelength. Note that operation 902 can be implemented in a wide variety of ways. For example, operation 902 can be implemented in any manner similar to that described herein, but is not limited to such.

At operation 904, one or more nanowires or nanoparticles (e.g., 110, 110', 110" and/or 110''') can be disposed on one or more surfaces of the light emitting diode. It is noted that the one or more nanowires or nano-particles can each be for receiving and converting the light (e.g., 108) into either red and green light (e.g., 104, 104' and/or 104") or red, green and blue light (e.g., 104, 104' and/or 104") that can be output from each nanowire or nanoparticle. It is understood that operation 904 can be implemented in a wide variety of ways. For example in various embodiments, the disposing of the one or more nanowires (or nanoparticles) can include growing them from one or more surfaces of the light emitting diode. In various embodiments, the disposing of the one or more nanowires (or nanoparticles) can include utilizing an atomic layer deposition technique or any other analogous film deposition techniques. In various embodiments, the disposing of the one or more nanowires (or nanoparticles) can include a first nanowire (or a first nanoparticle) of the plurality of nanowires (or nanoparticles) being doped differently than a second nanowire (or nanoparticle) of the plurality of nanowires (or nanoparticles). In various embodiments, the disposing of the one or more nanowires (or nanoparticles) can include utilizing a substrate that is foreign (e.g., 702) to the light emitting diode. The one or more nanowires (or nanoparticles) can be implemented with, but are not limited to, a group II-VI compound semiconductor materials and related alloys, a group III-V compound semiconductor materials and related alloys, any material having an ability to emit a broad range of spectrum covering red, green and blue, i.e. white light when mixed, as a result of absorbing light at around 500 nanometers (nm)+/−150 nm that comes from LED 102, and any material having a band gap approximately 500 nanometers (nm)+/−150 nm. The light emitting diode can include gallium nitride (GaN), aluminum gallium nitride (AlGaN), but is not limited to such. It is noted that operation 904 can be implemented in any manner similar to that described herein, but is not limited to such.

In accordance with various embodiments of the invention, it is understood that each of apparatuses 100, 200, 300, 400, 600, 700, 720, 800 and 820 can be implemented to include the combination of one or more nanowires (e.g., 110) along with one or more nanoparticles (e.g., 110'). In accordance with various embodiments of the invention, it is understood that technique 500 and method 900 can each be implemented to include the combination of one or more nanowires (e.g., 110) along with one or more nanoparticles (e.g., 110').

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents

What is claimed is:

1. An apparatus comprising:
a light emitting diode that is for outputting light comprising a blue wavelength;
a nanowire or nanoparticle coupled to a surface of said light emitting diode;
a second nanowire or nanoparticle coupled to said surface of said light emitting diode, wherein said nanowire is doped differently than said second nanowire; and
an electrode coupled to said light emitting diode, wherein said nanowire or nanoparticle is for receiving and converting said light into red and green light that is output from said nanowire or nanoparticle.

2. The apparatus of claim 1, wherein said light emitting diode and said nanowire are for generating white light.

3. The apparatus of claim 1, wherein said apparatus is a white light emitting diode including said light emitting diode, said nanowire or nanoparticle coupled to a said surface of said light emitting diode, and said second nanowire or nanoparticle coupled to said surface of said light emitting diode.

4. The apparatus of claim 1, wherein said nanowire or nanoparticle comprises a group II-VI compound semiconductors.

5. The apparatus of claim 1, wherein said light emitting diode comprises a group III-V compound semiconductors.

6. The apparatus of claim 1, wherein said surface of said light emitting diode comprises a non-single crystal material.

7. The apparatus of claim 1, wherein said nanowire or nanoparticle is implemented with a material selected from the group consisting of a group II-VI compound semiconductor materials and related alloys, a group III-V compound semiconductor materials and related alloys, and any material having a band gap approximately 500 nanometers (nm)+/−150 nm.

8. An apparatus comprising:
a light emitting diode that is for outputting light comprising an ultraviolet wavelength;
a nanowire or nanoparticle coupled to a surface of said light emitting diode;
a second nanowire or nanoparticle, wherein said nanowire is doped differently than said second nanowire; and
an electrode coupled to said light emitting diode, wherein said nanowire or nanoparticle is for receiving and converting said light into red, blue and green light that is output from said nanowire or nanoparticle.

9. The apparatus of claim 8, wherein said light emitting diode and said nanowire or nanoparticle are for generating white light.

10. The apparatus of claim 8, wherein said nanowire or nanoparticle and said second nanowire or nanoparticle each has a random orientation.

11. The apparatus of claim 8, wherein said nanowire or nanoparticle is coupled to said surface of said light emitting diode utilizing an atomic layer deposition or any other analogous film deposition techniques.

12. The apparatus of claim 8, wherein said nanowire or nanoparticle is single crystalline.

13. A method for fabricating an apparatus, the method comprising:
fabricating a light emitting diode for outputting light selected from the group consisting of a blue wavelength and an ultraviolet wavelength; and
disposing a nanowire or nanoparticle on a surface of said light emitting diode for receiving and converting said light into either red and green light or red, green and blue light that is output from said nanowire, wherein said disposing comprises growing said nanowire from said surface of said light emitting diode.

14. The method of claim 13, wherein said disposing comprises utilizing a utilizing an atomic layer deposition or any other analogous film deposition techniques.

15. The method of claim 13, wherein said disposing comprises disposing a plurality of nanowires or nanoparticles, wherein a first nanowire or nanoparticle of said plurality of nanowires or nanoparticles is doped differently than a second nanowire or nanoparticle of said plurality of nanowires or nanoparticles.

16. The method of claim 13, wherein said disposing comprises utilizing a substrate that is foreign to said light emitting diode.

17. The method of claim 13, wherein said nanowire or nanoparticle is implemented with a material selected from the group consisting of a group II-VI compound semiconductor materials and related alloys, a group III-V compound semiconductor materials and related alloys, and any material having a band gap approximately 500 nanometers (nm)+/−150 nm.

18. The method of claim 13, wherein said light emitting diode comprises gallium nitride.

\* \* \* \* \*

UNITED STATES PATENT AND TRADEMARK OFFICE
CERTIFICATE OF CORRECTION

PATENT NO.      : 8,188,494 B2
APPLICATION NO. : 11/477298
DATED           : May 29, 2012
INVENTOR(S)     : Nobuhiko P. Kobayashi et al.

It is certified that error appears in the above-identified patent and that said Letters Patent is hereby corrected as shown below:

In column 9, line 53, in Claim 3, after "coupled to" delete "a".

In column 10, line 42, in Claim 14, before "an atomic" delete "a utilizing".

Signed and Sealed this
Fifteenth Day of January, 2013

David J. Kappos
*Director of the United States Patent and Trademark Office*